United States Patent
Wang

(10) Patent No.: US 6,750,139 B2
(45) Date of Patent: Jun. 15, 2004

(54) DUMMY METAL PATTERN METHOD AND APPARATUS

(75) Inventor: Xiaojun Wang, Milpitas, CA (US)

(73) Assignee: Aurora Systems, Inc., San Jose, CA (US)

( * ) Notice: Subject to any disclaimer, the term of this patent is extended or adjusted under 35 U.S.C. 154(b) by 0 days.

(21) Appl. No.: 10/017,458

(22) Filed: Dec. 12, 2001

(65) Prior Publication Data

US 2003/0109120 A1 Jun. 12, 2003

(51) Int. Cl.$^7$ .......................... H01L 21/00; H01L 21/44
(52) U.S. Cl. ...................... 438/626; 438/692; 438/618; 438/687
(58) Field of Search ................................ 438/586, 129, 438/687, 618, 599; 716/21

(56) References Cited

U.S. PATENT DOCUMENTS

| | | | | |
|---|---|---|---|---|
| 4,916,514 A | * | 4/1990 | Nowak | 257/758 |
| 5,032,890 A | * | 7/1991 | Ushiku et al. | 257/211 |
| 5,066,997 A | * | 11/1991 | Sakurai et al. | 257/211 |
| 5,278,105 A | * | 1/1994 | Eden et al. | 438/129 |
| 5,441,915 A | * | 8/1995 | Lee | 438/631 |
| 5,459,093 A | * | 10/1995 | Kuroda et al. | 438/599 |
| 5,790,417 A | * | 8/1998 | Chao et al. | 716/21 |
| 5,854,125 A | * | 12/1998 | Harvey | 438/626 |
| 6,093,631 A | * | 7/2000 | Jaso et al. | 438/618 |
| 6,099,992 A | * | 8/2000 | Motoyama et al. | 430/5 |
| 6,281,049 B1 | * | 8/2001 | Lee | 438/129 |
| 6,413,863 B1 | * | 7/2002 | Liu et al. | 438/687 |
| 6,441,469 B1 | * | 8/2002 | Chrysostomides et al. | 257/659 |
| 6,448,591 B1 | * | 9/2002 | Juengling | 257/211 |
| 6,486,066 B2 | * | 11/2002 | Cleeves et al. | 438/692 |

* cited by examiner

*Primary Examiner*—Michael Lebentritt
(74) *Attorney, Agent, or Firm*—Henneman & Saunders; Larry E. Hanneman, Jr.

(57) ABSTRACT

A method for creating dummy fill metal patterns (10) in a reflective LCOS array (11) in order to minimize distortion in images reflected from mirrors (14) thereof. A metal fill pattern (50) is selected from an area near a functional circuitry (32) pattern. The functional circuitry (32) pattern is grown to create a margin area (34) leaving a fill area (38) to be filled. The metal fill pattern (50) is trimmed to the outline of the fill area (38). Metal sliver(s) (66) or other such artifacts are removed to conform to design specifications, thereby creating a second trimmed metal traces (74) pattern. The second fill metal traces (74) are combined with the functional circuitry (32) traces to form a completed metal trace pattern (76) in an overlay functional and dummy patterns operation (78).

12 Claims, 5 Drawing Sheets

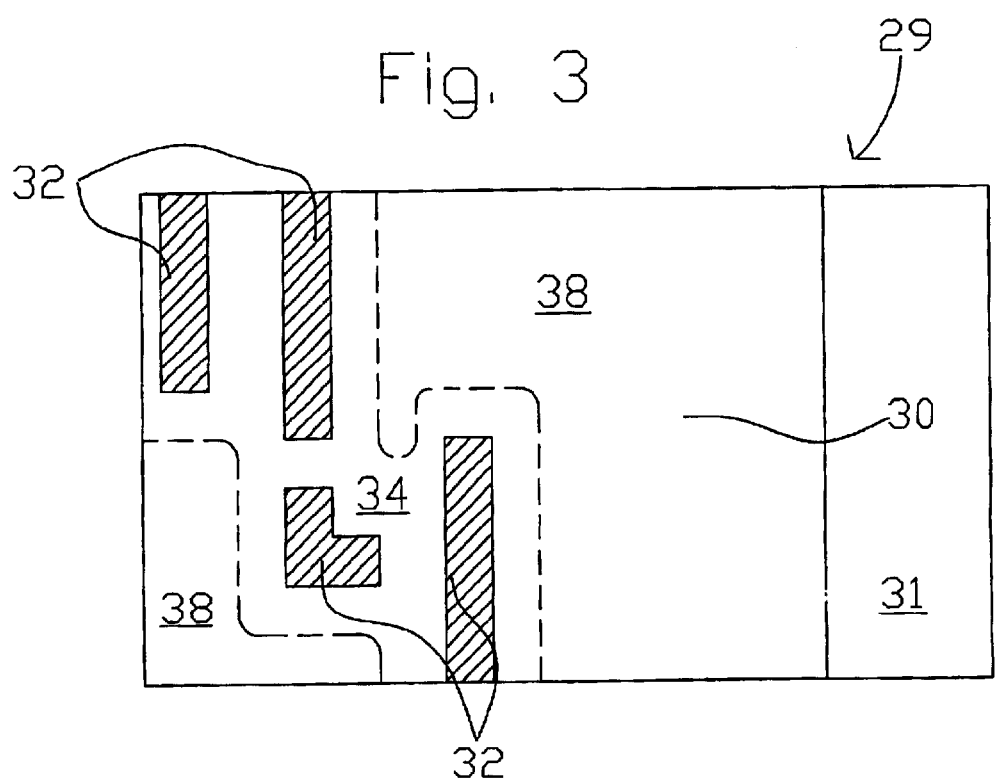
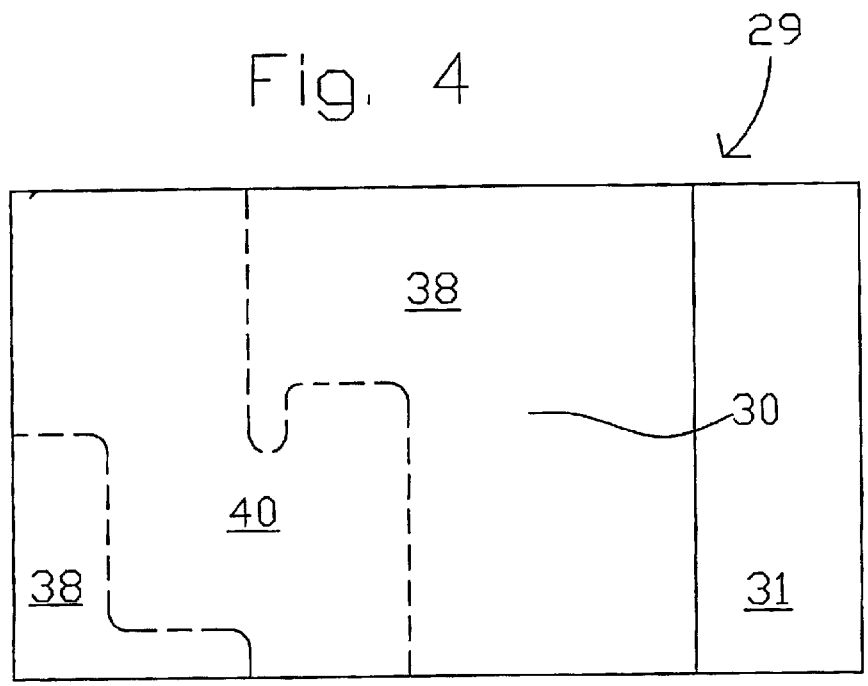

DUMMY METAL PATTERN METHOD AND APPARATUS

BACKGROUND

1. Field of the Invention

The present invention relates to the field of integrated circuit manufacture, and more specifically to an improved method and construction for the manufacture of liquid crystal on silicon ("LCOS") display arrays. The predominant current usage of the present inventive improved dummy metal pattern method and apparatus is in the construction of reflective LCOS arrays for projection display devices, wherein it is desirable to keep the surface of the array as flat and flawless as possible.

2. Description of the Background Art

In the construction of light reflective or conductive LCOS arrays there will be areas of one or more metal layers wherein there is no circuitry. This situation may occur within the boundaries of the imaging surfaces of the array, or around the perimeter thereof. A similar situation exists where there is very low density circuitry, which might leave substantial unfilled areas with no circuitry therein on the layer. Wherever such absence of circuitry or low circuitry density occurs, such condition is undesirable, since areas of the surface of the array will not be evenly supported, as compared to the areas above the functional circuitry. Since it is critical that the surface of the array be as flat and uniform as possible, in order to preserve the integrity and quality of the image produced thereby, it is desirable to use some method and/or apparatus for generally uniformly supporting the surface layers even where a lack of circuitry might otherwise provide no support.

It is known in the art to provide "dummy" circuitry within such areas. In the prior art, such dummy circuitry has consisted of a regular pattern, which pattern has been largely a matter of individual preference. A typical example of such dummy circuitry is a uniform pattern of stripes. While such regular patterns do somewhat achieve the desired goal of supporting the surface layers, the fact remains that a regular pattern is not alike to the adjacent circuitry, and therefore some substantial difference in the amount and quality of support provided to surface layers continues to exist. It would be desirable to have some method or means for providing support to the surface layers of a reflective LCOS array wherein such support is generally uniform under the entire surface of the array, regardless of whether or not such support is provided by operational circuitry patterns or dummy metal. However, to the inventor's knowledge no such method or means has existed in the prior art.

SUMMARY

Accordingly, it is an object of the present invention to provide a method and apparatus for minimizing the perceptible effects of distortion caused by uneven underlayment of the surface of an LCOS imager.

It is another object of the present invention to provide a method and apparatus for improving the quality of an image produced by a reflective LCOS array.

It is yet another object of the present invention to provide a method and apparatus for producing a reflective LCOS array which can be readily implemented using known manufacturing techniques.

Briefly, a known embodiment of the present invention is an arrangement of metal on unused areas of a metal layer of an LCOS imager wherein such metal closely resembles actual functional nearby circuitry patterns. According to the present inventive method, a pattern of circuitry is chosen to fill otherwise unused areas of a metal layer. A space to be filled by the dummy metal is created by growing a margin around existing circuitry. The dummy metal pattern is then trimmed to fill such space. Then, final adjustments are made to the fill pattern by trimming away slivers of metal, and the like, to conform to the design criteria.

These and other objects and advantages of the present invention will become clear to those skilled in the art in view of the description of modes of carrying out the invention, and the industrial applicability thereof, as described herein and as illustrated in the several figures of the drawing. The objects and advantages listed are not an exhaustive list of all possible advantages of the invention. Moreover, it will be possible to practice the invention even where one or more of the intended objects and/or advantages might be absent or not required in the application.

Further, those skilled in the art will recognize that various embodiments of the present invention may achieve one or more, but not necessarily all, of the above described objects and advantages. Accordingly, the listed advantages are not essential elements of the present invention, and should not be construed as limitations.

BRIEF DESCRIPTION OF THE DRAWINGS

FIG. 3 is an example of functional circuitry showing a safety margin created thereabout;

FIG. 4 is an example of a fill area according to the present invention;

DETAILED DESCRIPTION

Figure 1:
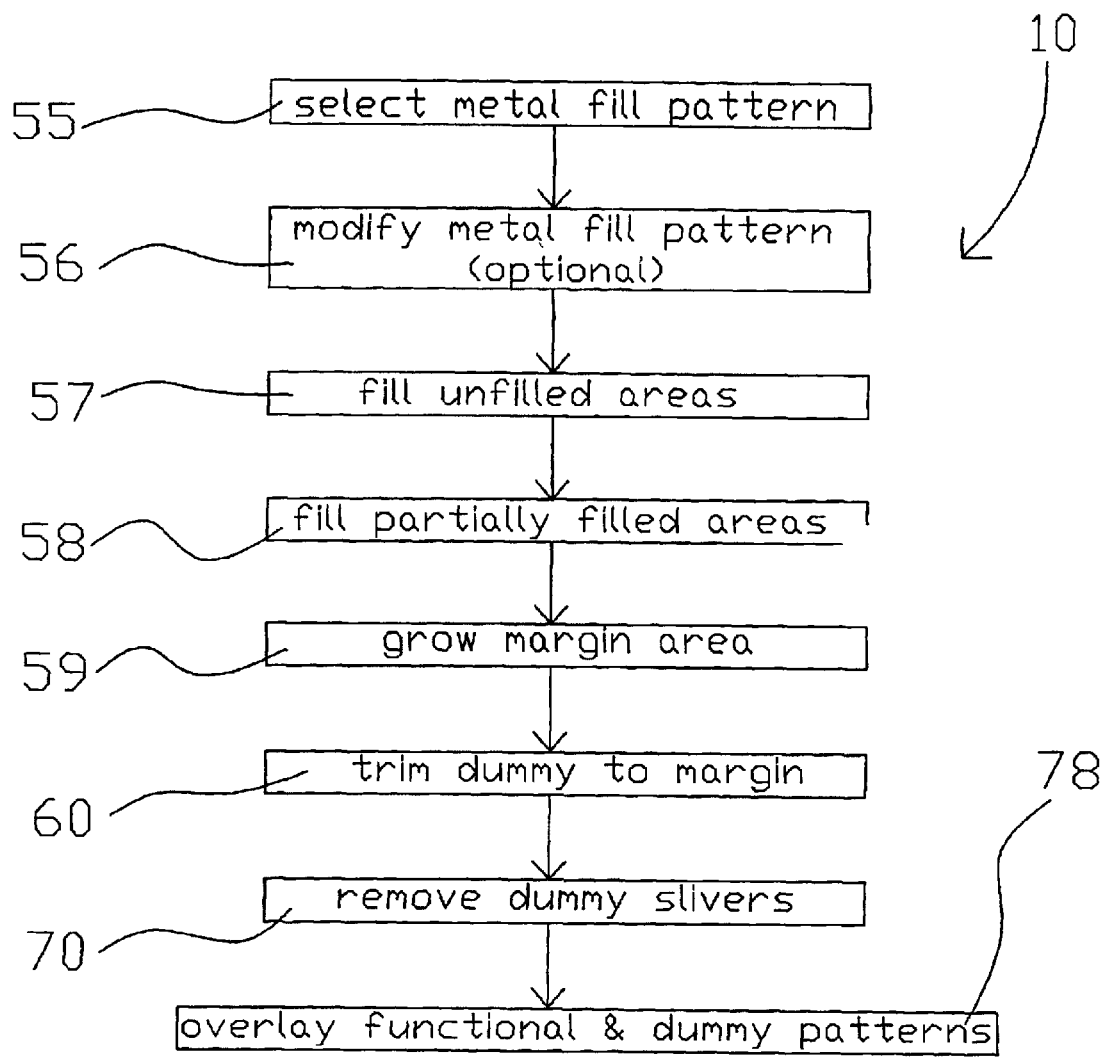
FIG. 1 is a flow diagram of a method for creating dummy metal fill patterns, according to the present invention.

The embodiments and variations of the invention described herein, and/or shown in the drawings, are presented by way of example only and are not limiting as to the scope of the invention. Unless otherwise specifically stated, individual aspects and components of the invention may be omitted or modified, or may have substituted therefore known equivalents, or as yet unknown substitutes such as may be developed in the future or such as may be found to be acceptable substitutes in the future. The invention may also be modified for a variety of applications while remaining within the spirit and scope of the claimed invention, since the range of potential applications is great, and since it is intended that the present invention be adaptable to many such variations.

Figure 2:
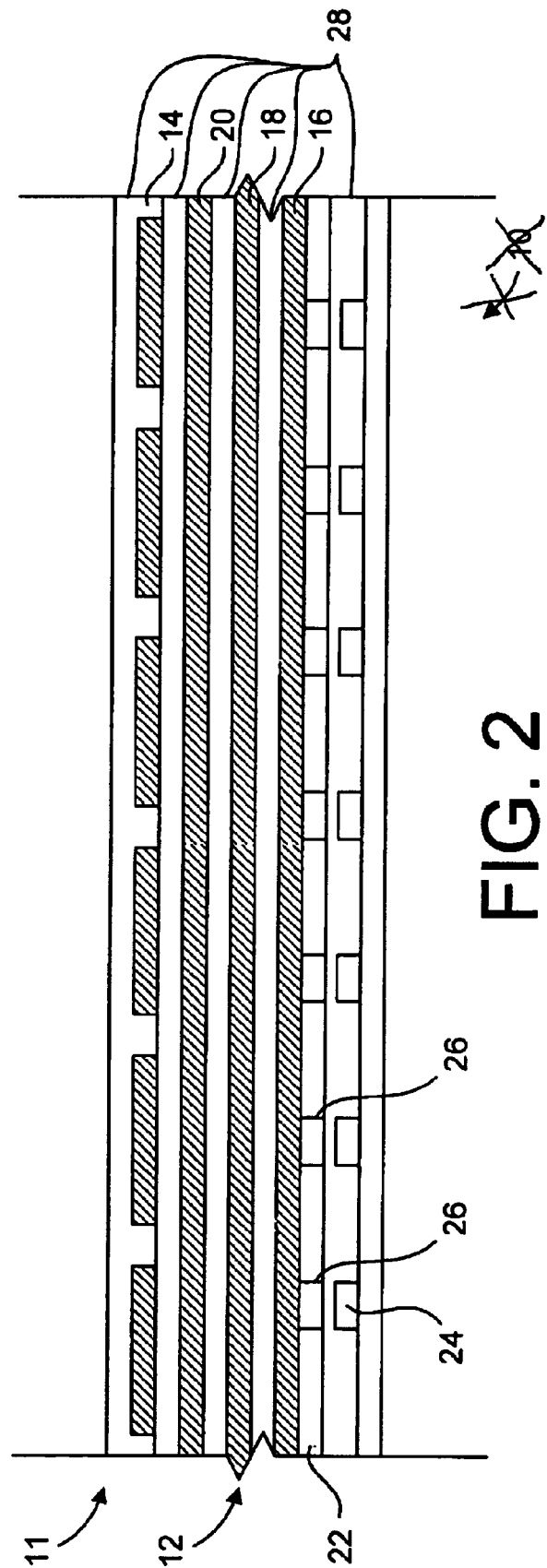
FIG. 2 is a diagrammatic cross sectional elevational view of a reflective LCOS array, such as might employ the present inventive method and construction.

An example of the present invention is a method for producing dummy metal patterns shown in the flow diagram of FIG. 1, and designated therein by the general reference character 10. FIG. 2 is a side elevational, partially cross sectional diagrammatic (not to scale) view of a small portion of a reflective LCOS array 11, such as might employ the present inventive method and construction. The reflective LCOS array 11 has, not unlike conventional prior art devices, a plurality of material layers 12. The embodiment discussed by way of example herein has a mirror layer 14, a first metal (M1) layer 16, a second metal (M2) layer 18, and a third metal (M3) layer 20. In the present example also are a poly (recrystallized silicon) layer 22 and a diffusion layer 24. One skilled in the art will recognize that where traces on the poly layer 22 mask those of the diffusion layer 24 are semiconductor junctions 26. Also visible in the view of FIG. 2 are a plurality of silicon dioxide insulating layers 28.

One skilled in the art will recognize that a lesser or greater quantity of layers might be used to construct such an array. The example of FIG. 2 is intended only to further the understanding of the present invention. Also, one skilled in the art will recognize that the example of FIG. 2 is not an exhaustive list of all of the components of such an array. Additional features such as a substrate on which the material layers 12 are built, a case, external electrical connectors, and the like are omitted from the view of FIG. 2 as being unnecessary to an understanding of the invention.

FIG. 3 is a top plan view of an example of a small portion of a circuitry area 29 such as might be used in an example metal layer 30 (e.g., layer 20 underlying the mirror layer 14 in FIG. 2) of the reflective LCOS array 11. An unfilled area 31 represents margin areas, or the like, of the example metal layer 30 wherein there is no functional circuitry. In the view of FIG. 3 can also be seen small portions of functional circuitry 32. The circuitry area 29 is representative of a portion of one of the metal layers 14, 16, 18, and 20 wherein there is some circuitry, but also wherein there is not sufficient circuitry to provide an even underlayment for layers thereabove. According to the present invention, a margin area 34 is created around the functional circuitry 32, as will be discussed in greater detail hereinafter. One skilled in the art will recognize that the area around the functional circuitry 32 can be thus "grown" using conventional integrated circuit layout software. The size of the margin area 34 will be dictated by the particular design parameters being used, with the criterion being that the size of the margin area 34 will be sufficient to provide the required distance between the functional circuitry 32 and any material to be added, as will be discussed hereinafter. One or more fill areas (two are shown in the view of FIG. 3) are those portions of the circuitry area 29 which are not within the margin area 34 and which, according to the present invention, should be treated as described hereinafter.

FIG. 4 is a diagram, similar to that of FIG. 3, showing the functional circuitry area 29 with a functional circuitry area 40 distinct from the fill area 38. The functional circuitry area 40 includes both the functional circuitry 32 traces and the margin area of FIG. 3 which is grown thereabout as described above, and which will be discussed in further detail in relation to the present inventive method described hereinafter.

Figure 5:
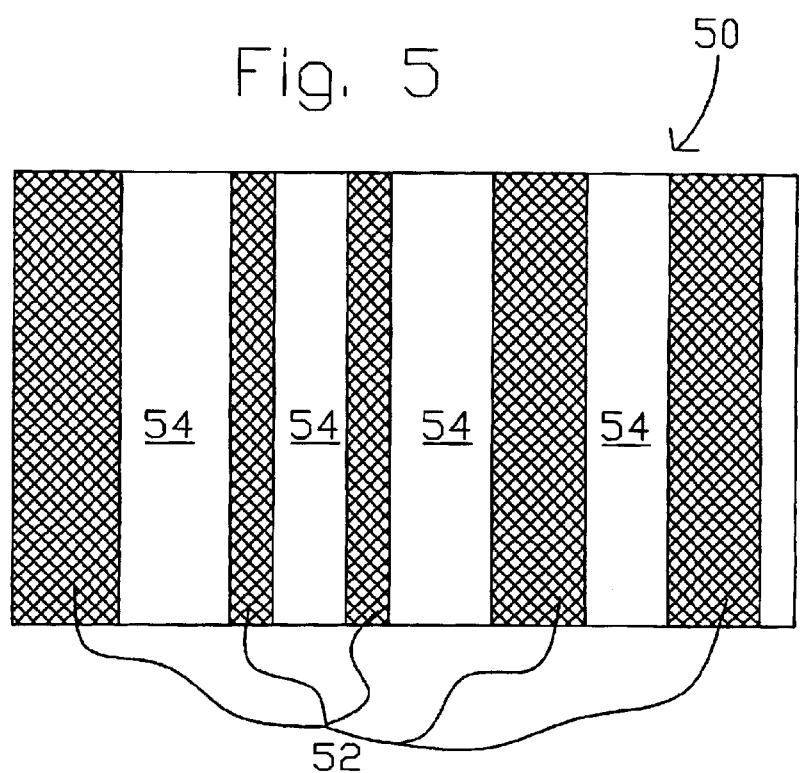
FIG. 5 is an example of a dummy metal pattern according to the present invention.

FIG. 5 is an example of a portion of a metal fill pattern 50. The metal fill pattern 50 has a plurality of fill metal traces 52 separated by unfilled space 54. According to the present invention, the fill metal traces 52 of the metal fill pattern 50 will be selected to be alike to adjacent functional circuitry (not shown) which might lie adjacent or near to the portion of the example metal layer 30 (FIG. 3) on which the functional circuitry 32 of FIG. 3 is found. In the example presently described, the metal fill pattern 50 is selected from the metal traces of the particular metal layer 14, 16, 18 or 20 on which the metal fill pattern 50 is to be used. As will be F discussed in more detail hereinafter, should there be substantial gaps in such metal fill pattern 50 it will be an option of the operator to add metal to complete the metal fill pattern 50. In the embodiment of the invention described herein the metal fill pattern 50 is completed by a visual inspection and operator intervention, as will be discussed in relation to the inventive method hereinafter. It is within the scope of the invention that the metal fill pattern could also be completed using a more automated method, according to either a known algorithm or another yet to be developed.

Referring again to FIG. 1, as previously discussed herein, an initial step in the present inventive method 10 is a select metal fill pattern operation 55 wherein the metal fill pattern 50 is selected. As previously discussed herein, in this present example of the invention the metal fill pattern 50 is selected from the metal traces of the metal layer 16, 18 or 20 on which the inventive method 10 is currently being performed. A user will select a metal fill pattern 50 which is representative of circuitry on that layer 14, 16, 18 or 20 and further which generally will provide an even underlayment for layers above. As has also been previously discussed herein, although the selected metal fill pattern 50 may be an unmodified version of an example of circuitry on the particular layer 16, 18 or 20, it is within the scope of the invention that some modifications can be made to the metal fill pattern 50 to cause it to more fully or regularly fill the area covered thereby. If it is deemed necessary or desirable, such relatively minor modifications to the metal fill layer 50 can optionally be made in a modify metal fill pattern operation 56.

In a fill unfilled areas operation 57, areas of the metal layer 14, 16, 18 or 20 (such as the unfilled area 31 of FIG. 3), wherein it is required to have support and further wherein there is no circuitry, are filled with iterations of the metal fill layer 50. As many iterations of the metal fill layer 50 are used as may be required to fill the unfilled area 31, or the like. For purposes of illustrating the invention only, the unfilled area 31 in the example shown is quite small, and only a portion of the metal fill layer 50 is required to fill the unfilled area 31, as will be described in more detail hereinafter.

Figure 6:
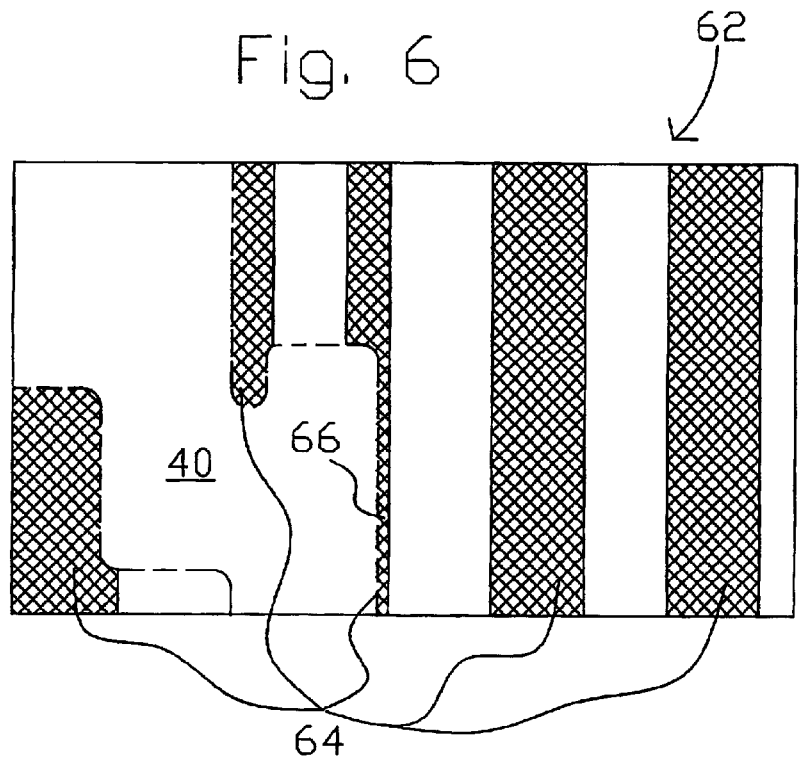
FIG. 6 is an example of a dummy metal pattern trimmed to fit the fill area of FIG. 3.

In a fill partially filled areas operation 58, areas such as the circuitry area 29, discussed above, are filled. As discussed previously herein, the margin area 34 (FIG. 3) is grown around the functional circuitry 32 in a grow margin area operation 59. In a trim dummy to margin operation 60 (FIG. 1) the fill metal traces 52 (FIG. 5) are trimmed to eliminate overlap with the functional circuitry area 40 (FIG. 4). This will leave a first trimmed fill pattern 62 as seen in the diagram of FIG. 6. The first trimmed fill pattern 62 has trimmed metal traces 64 which are located only overlying the fill area 38 of FIGS. 3 and 4 and, in this example, the unfilled area 31 (FIG. 3). In the example of FIG. 5, it can be seen that the first trimmed metal traces 64 has a metal sliver 66 which is left where trimming away the functional circuitry area 40 (FIG. 4) leaves only a thin portion of the fill metal traces 52 (FIG. 5) behind.

Figure 7:
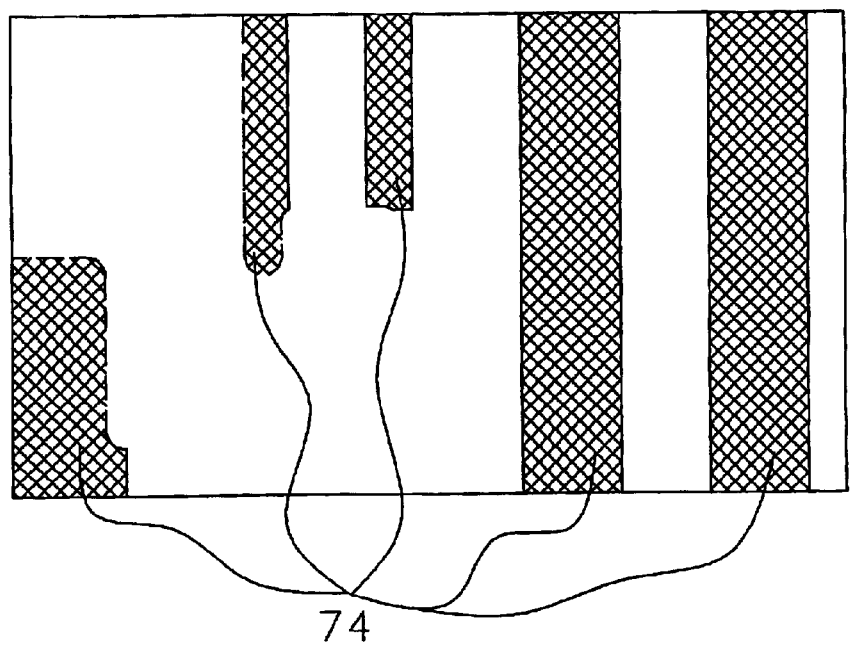
FIG. 7 is an example of the dummy metal pattern of FIG. 5 trimmed to meet design criteria.

One skilled in the art will recognize that design parameters will prohibit very thin metal traces such as the metal sliver 66 shown, by way of example, in FIG. 6. Therefore, in a remove dummy slivers operation 70 (FIG. 1), such artifacts which are prohibited by design parameters are eliminated. This will leave a second trimmed fill pattern 72, such as that shown in the example diagram of FIG. 7. The second trimmed fill pattern 72 having thereon a plurality of second trimmed metal traces 74. In the present example, the second trimmed metal traces 74 are alike to the first trimmed metal traces 64 of FIG. 6 with the exception that artifacts such as the metal sliver 66 have been removed.

Figure 8:
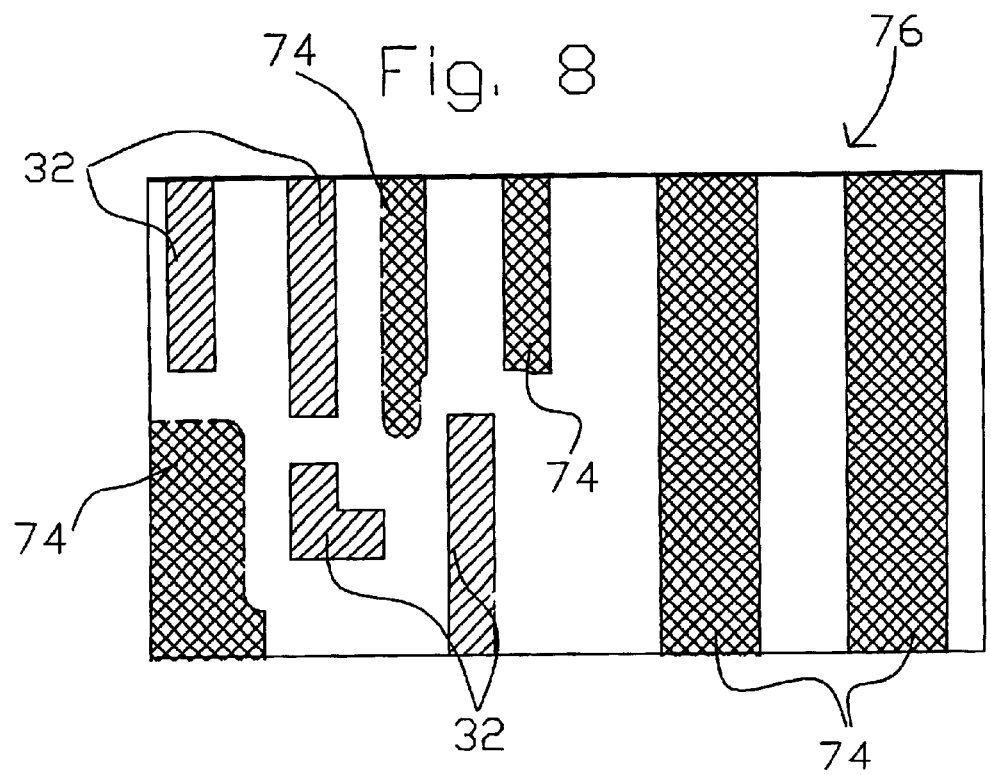
FIG. 8 is an example of the functional circuitry of FIG. 2 combined with the dummy metal pattern of FIG. 6.

FIG. 8 is an example of a completed metal trace pattern 76. The completed metal trace pattern 76 is created in an overlay functional and dummy patterns operation 78 (FIG. 1) by combining the functional circuitry 32 with the second trimmed metal traces 74. According to the present invention, the surface of the circuitry area 29 and the unfilled area 31 (FIG. 3) are filled in with patterns which general resemble the functional circuitry 32 (FIG. 3) thereabout.

One skilled in the art will recognize that the operations 59, 60, 70 and 78 can be repeated for each different circuitry area 29 to be filled in according to the present inventive method 10. Similarly, in the fill unfilled areas operation 57 as many iterations of the metal fill pattern 50 as necessary to fill the existing quantity of unfilled areas 31 can be used. The quantity of iterations of the inventive method 10 and each step thereof will be peculiar to the particular application.

Various modifications may be made to the invention without altering its value or scope. For example, the functional circuitry 32 and the metal fill pattern 50 depicted herein are used by way of example only. The invention should be applicable to essentially any such patterns. Also, to the example of removing the metal sliver 66 in the remove dummy slivers operation 70 is merely an example of modifications which might be made to the metal fill pattern 50 to cause it to conform to specific design parameters or specifications.

All of the above are only some of the examples of available embodiments of the present invention. Those skilled in the art will readily observe that numerous other modifications and alterations may be made without departing from the spirit and scope of the invention. Accordingly, the disclosure herein is not intended as limiting and the appended claims are to be interpreted as encompassing the entire scope of the invention.

INDUSTRIAL APPLICABILITY

The inventive method for creating dummy fill metal patterns 10 is intended to be widely used in the production of integrated circuits, and in particular video imaging devices, especially where the size and/or criticality of the display requirements call for minimal distortion and optimal image clarity and resolution. The present inventive method is potentially applicable to any metal (circuitry) layer of the array stack. However, the inventor believes it to be more useful and necessary the closer such level is to the top layer, wherein reduction of physical distortion is most critical, although the inventor acknowledges that other authorities have proposed that such correction is most critical in the lower levels.

The inventive method for creating dummy fill metal patterns 10 can be used wherever there is low density circuitry, or where an area of essentially no functional circuitry adjoins an area of functional circuitry. Since the metal fill pattern 50 is chosen from patterns already existing on a particular metal layer 14, 16, 18 or 20, it is more likely that metal fill on such layer will be alike to, and will provide support similar to, such existing functional circuitry.

Since the method for creating dummy fill metal patterns 10 of the present invention may be readily produced using known manufacturing methods and operations, and since the advantages as described herein are provided, it is expected that it will be readily accepted in the industry. For these and other reasons, it is expected that the utility and industrial applicability of the invention will be both significant in scope and long-lasting in duration.

I claim:

1. A method for creating a dummy metal fill pattern near functional circuitry, comprising:

creating a margin area around the functional circuitry;

selecting a dummy metal fill pattern of alternative functional circuitry; wherein the alternative functional circuitry is a selected portion of functional circuitry from a metal layer on which the dummy metal fill pattern is to be used;

trimming the dummy metal fill pattern to the margin area to create a trimmed fill pattern; and overlaying said trimmed fill pattern and the functional circuitry.

2. The method for creating a dummy metal fill pattern of claim 1, and further including:

removing excess metal from the dummy metal fill pattern.

3. The method for creating a dummy metal fill pattern of claim 2, wherein:

the excess metal is at least one metal sliver.

4. The method for creating a dummy metal fill pattern of claim 3, wherein:

the metal sliver is a thin strip of metal created when the margin area is removed from the dummy metal fill pattern.

5. The method for creating a dummy metal fill pattern of claim 1, wherein:

the alternative functional circuitry is selected to be alike to that near the functional circuitry.

6. The method for creating a dummy metal fill pattern of claim 1, wherein:

the dummy metal fill pattern is created on a metal layer of an LCOS array.

7. The method for creating a dummy metal fill pattern of claim 1, wherein:

the dummy metal fill pattern is created on a layer under a mirror layer of an LCOS array.

8. The method for creating a dummy metal fill pattern of claim 1, wherein:

the dummy metal fill pattern is created on a layer of a reflective LCOS array.

9. The method for creating a dummy metal fill pattern of claim 1 wherein:

said margin area is created by growing the area of the functional circuitry.

10. A method for providing dummy fill in a LCOS array, comprising:

selecting a metal fill pattern from functional circuitry on a layer of the array on which the metal fill pattern is to be used; and filling an unfilled area with the metal fill pattern.

11. The method for providing dummy fill of claim 10, and further including;

filling a partially filled area with a portion of the metal fill pattern.

12. A method for providing dummy fill in a LCOS array, comprising:

selecting a metal fill pattern from functional circuitry on a layer of the array;

filling an unfilled area with the metal fill pattern; and filling a partially filled area with a portion of the metal fill pattern.

* * * * *